United States Patent [19]
Mukuda et al.

[11] Patent Number: 5,432,514
[45] Date of Patent: Jul. 11, 1995

[54] METHOD AND APPARATUS FOR DETECTING ABNORMALITY IN ANALOG-TO-DIGITAL CONVERTER

[75] Inventors: Youji Mukuda, Hadano; Yoshiyuki Ozawa, Kanagawa; Masuo Murano, Hadano, all of Japan

[73] Assignees: Hitachi, Ltd., Tokyo; Hitachi Computer Engineering Co., Ltd., Kanagawa, both of Japan

[21] Appl. No.: 164,476

[22] Filed: Dec. 9, 1993

[30] Foreign Application Priority Data

Dec. 14, 1992 [JP] Japan .................. 4-332787

[51] Int. Cl.⁶ .............................................. H03M 1/10
[52] U.S. Cl. ...................................... 341/120; 341/155
[58] Field of Search ............... 341/120, 118, 119, 121, 341/155

[56] References Cited
U.S. PATENT DOCUMENTS
4,535,319  8/1985  Penny ................................ 341/120

FOREIGN PATENT DOCUMENTS
3-268610  3/1990  Japan .

Primary Examiner—Brian K. Young
Attorney, Agent, or Firm—Fay, Sharpe, Beall, Fagan, Minnich & McKee

[57] ABSTRACT

A reference voltage for an analog-to-digital (A/D) converting unit is converted into plural digital values through the effect of the A/D converting unit. A difference between an average value of the digital values and an ideal reference value is derived. If the different is larger than a predetermined allowable value, it is determined that a transient abnormality takes place in an A/D converter system. The last measured reference voltage and its related digital input signal are disallowed to be used as measured values. If detection of a transient abnormality serially takes place predetermined times, it is determined that a constant abnormality takes place in the A/D converter system.

19 Claims, 5 Drawing Sheets

→ TIME

16

| | Verf | VD | VB | VL | I₁ | I₂ | ...... | Iₙ |
|---|---|---|---|---|---|---|---|---|
| 1 | 9.76 | 11997.48 | −11931.6 | 4997.56 | | | | |
| 2 | 7.32 | 11968.2 | −11931.6 | 4994.68 | | | | |
| 3 | 4.88 | 11931.6 | −11931.6 | 4989.8 | | | | |
| 4 | 7.32 | 11931.6 | −11931.6 | 4989.8 | | | | |
| 5 | 4.88 | 11931.6 | −11931.6 | 4989.8 | | | | |
| 6 | 2.44 | 11931.6 | −11931.6 | 4989.8 | | | | |
| 7 | 2.44 | 12034.08 | −11931.6 | 4989.8 | | | | |
| 8 | 0.00 | 12034.08 | −11931.6 | 4989.8 | | | | |
| 9 | 0.00 | 12034.08 | −11931.6 | 4989.8 | | | | |
| 10 | 2.44 | 12092.64 | −11931.6 | 4989.8 | | | | |
| 11 | 4.88 | 12092.64 | −11931.6 | 4989.8 | | | | |
| 12 | 7.32 | 12092.64 | −11931.6 | 4989.8 | | | | |
| 13 | 4.88 | 12092.64 | −11931.6 | 4989.8 | | | | |
| 14 | 7.32 | 12092.64 | −11931.6 | 4989.8 | | | | |
| 15 | 7.32 | 12092.64 | −11931.6 | 4989.8 | | | | |
| 16 | 4.88 | 12092.64 | −11931.6 | 4989.8 | | | | |

METHOD AND APPARATUS FOR DETECTING ABNORMALITY IN ANALOG-TO-DIGITAL CONVERTER

BACKGROUND OF THE INVENTION

The present invention relates to a method and an apparatus for detecting an abnormality in an analog-to-digital converter, and more particularly to the method and the apparatus for detecting an abnormality which method and apparatus are suitable to an analog-to-digital converter required to produce a highly accuracy and reliable output.

To collect information about an environment represented by various analog values, in general, an analog-to-digital converter (referred to as an A/D converter) is now widely used.

The following description will be oriented to the general arrangement of the A/D converter. Plural analog signals inputted from the external are selected in an input selecting unit. The selected analog signal is added to an analog-to-digital (A/D) converting unit through a signal amplifying unit so that the selected analog signal may be converted into the digital signal in the A/D converting unit. Then, the digital signal is outputted at an output unit. The timing on which each of A/D converting operations is executed is determined by the control unit.

The A/D converter needs some kinds of voltages such as a reference voltage, a supply voltage, and a logic voltage for its operation.

This type of A/D converter has a disadvantage that if one or more of those necessary voltages are partially fluctuated, the digital signal converted from the corresponding analog signal may not be kept constant.

In the technique disclosed in JP-A-3-268610, in addition to the analog signal to be converted, the necessary voltage to the A/D converter such as a reference voltage is supplied to the input selecting unit. When the input selecting unit selects the reference voltage, the reference voltage is supplied from the input selecting unit to the A/D converting unit, in which it is converted to the corresponding digital value. Then, the difference between the converted digital value and a predetermined value is taken. If the difference is equal to or less than a predetermined allowable value, the correction is automatically executed. If the difference is more than the predetermined allowable value, it is determined that abnormality takes place.

The technique disclosed in JP-A-3-268610, however, operates to immediately determine that the A/D converter is abnormal even if a transient fault (for example, noises) comes from the outside. If the reference voltage or the supply voltage may be variable, the output of the A/D converter is less reliable, because the output is the converted digital value. Moreover, the technique disables to determine if the detected abnormality is transient or fatal. In the case of abnormality occurring in the supply voltage, it is fatal.

SUMMARY OF THE INVENTION

It is an object of the present invention to provide a method and an apparatus for detecting an abnormality in an A/D converter which method and apparatus enable to prevent erroneous detection or lowering of A/D converting accuracy resulting from transient disturbances such as noises.

It is a further object of the present invention to provide a method and an apparatus for detecting an abnormality in an A/D converter which method and apparatus enable to determine if the detected abnormality is transient or fatal. In the case of abnormality occurring in the supply voltage, it is fatal.

In carrying out the object, a method and an apparatus for detecting an abnormality in an A/D converter according to an aspect of the present invention are arranged to periodically convert a reference voltage for analog-to-digital conversion into a digital signal, compare an average value of several converted values with an ideal reference value, and determine that abnormality takes place in the A/D converter if the difference is more than a predetermined allowable value.

Moreover, a method and an apparatus for detecting an abnormality in an A/D converter according to another aspect of the present invention are arranged to periodically convert a supply voltage used inside of the A/D converter into a digital signal, compare an average value of plural converted values with an ideal reference value, and determine whether or not abnormality takes place in the A/D converter if the difference is more than a predetermined allowable value.

If abnormal states serially take place more times than predetermined times, it is determined as a constant abnormality.

Further, the method and the apparatus operate to serially and periodically convert plural voltages for analog-to-digital conversion into digital signals and derive an average value of plural converted digital signals for each of the voltages for analog-to-digital conversion. Then, the average value is compared with the corresponding ideal reference value. If the difference is more than a predetermined allowable value, it is determined that an abnormality takes place in the A/D converter.

Similarly, an average value is derived about a supply voltage used inside of the A/D converter. The average value is compared with an ideal reference value held inside of the A/D converter. If the difference is more than a predetermined value, it is determined that an abnormal state takes place in the A/D converter.

In addition, in either case, if the times of the serial abnormality occurrences stay within the predetermined times, the detected abnormality is determined as an intermittent or a transient one. During the interval, the output of the converted signal to the outside is inhibited.

If the serial times of abnormality occurrence exceed the predetermined times, it is determined that a constant abnormality takes place in the A/D converter. On the determination, the A/D converter is temporarily stopped so that the fact may be displayed or reported to the outside.

DESCRIPTION OF THE PREFERRED EMBODIMENTS

Hereafter, an embodiment of the invention will be discussed in detail with reference to the drawings.

Figure 1:
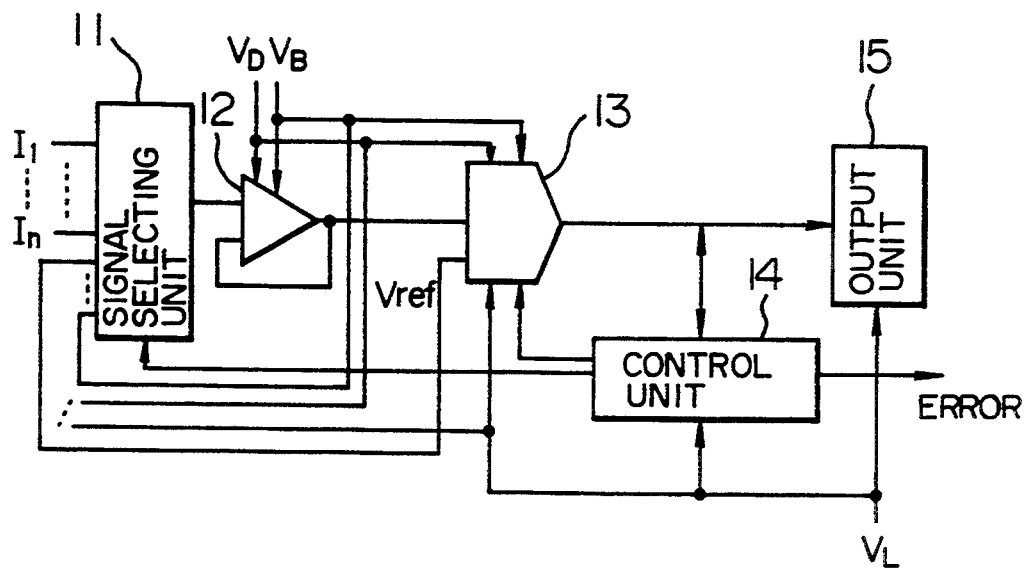
FIG. 1 is a circuit diagram showing an A/D converter according to an embodiment of the present invention.

FIG. 1 shows an arrangement of an A/D converter to which the present invention applies. As shown, the A/D converter is arranged to have a signal selecting unit 11 for selecting one of analog signals (I1 to In) inputted from the outside, a reference voltage Vref (e.g., 0 V), and supply voltages VD (e.g., 12 V), $V_B$ (e.g., +5 V), the latter three voltages of which are used inside of the A/D converter itself, an amplifying unit 12 for amplifying a selected analog signal sent from the signal selecting unit 11, an A/D converting unit 13 for converting an analog signal sent from the amplifying unit 12 into a digital signal, a control unit 14 for controlling these components 11, 12 and 13, and an output unit 15 for displaying an error or reporting it to the outside.

Figure 2:
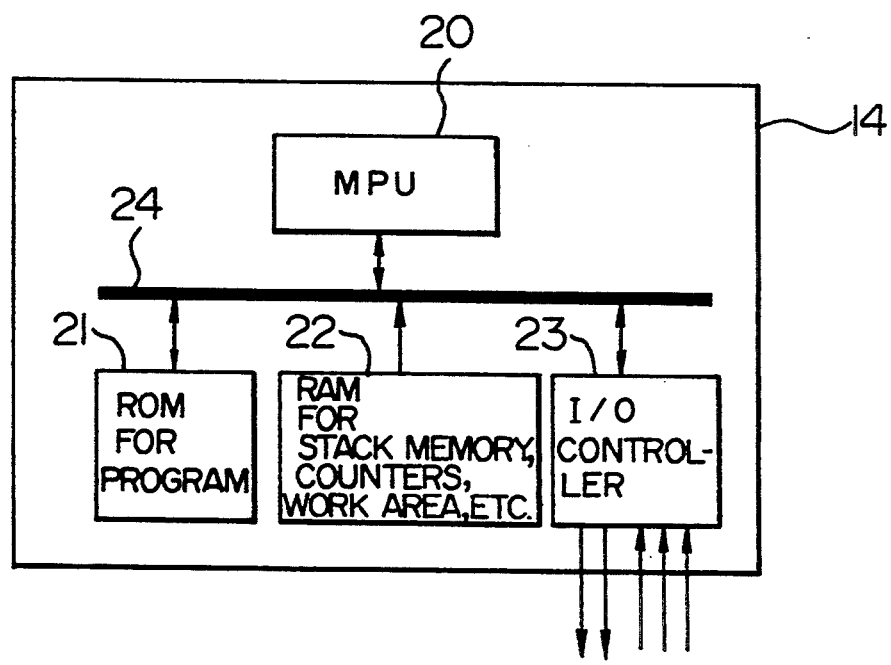
FIG. 2 is a block diagram showing an arrangement of a control unit shown in FIG. 1.

FIG. 2 shows an arrangement of the control unit 14 shown in FIG. 1. In FIG. 2, a numeral 20 denotes a micro processor unit (MPU) which controls the operation of the control unit according to a program stored in a read-only memory (ROM) 21. A numeral 22 denotes a random access memory (RAM) which includes a working area to be used by the MPU 20, a stack memory area (to be discussed later), and a counter area built in itself. A numeral 23 denotes an I/O controller which includes control signal lines for outputting timing signals for indicating switching of the signal selecting unit 11 and timing for starting analog-to-digital conversion of the A/D converting unit 13 and data lines for receiving converted digital signals from the A/D converting unit 13, under the control of the MPU 20. The MPU 20, the ROM 21, the RAM 22 and the I/O controller are connected with one another through a bus 24.

Figures 6, 7:
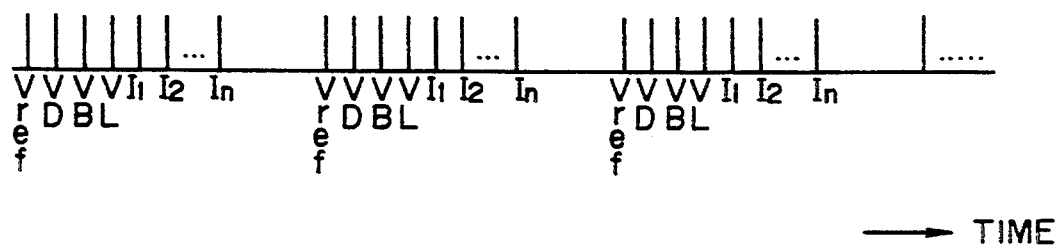
FIG. 6 is a chart showing a switching timing for selecting an input signal in the A/D converter shown in FIG. 1.
FIG. 7 is a view showing an arrangement of a stack memory provided in a control unit of the A/D converter shown in FIG. 1.

The RAM 22 inside of the control unit 14 provides a stack memory 16 for storing a converted digital value as shown in FIG. 7.

In addition, the amplifying unit 12 provides a function of matching impedance between the analog signal and the A/D converting unit 13.

The A/D converting unit 13 operates to perform an analog-to-digital conversion with respect to an analog signal selected by the signal selecting unit 11 under the control of the control unit 14. The converted digital value is stored in the stack memory 16. The selecting timing is as shown in FIG. 6. That is, all the signals are converted within one period according to a predetermined sequence.

A series of signals are periodically switched. The time of one period is about 25 milli-seconds. The switching timing of the analog input signal is determined by the control unit 14.

FIG. 6 shows a switching (converting) timing of each signal over some periods started from a certain period. In this embodiment, at each period, the reference voltage Vref is selected and then is analog- to-digital converted. The resulting digital signal is stored in the area for storing Vref at this period, which area is provided in the stack memory 16. This is because the reference voltage has the most significant effect on the measuring accuracy.

Next, the supply voltage VD is selected and is analog-to-digital converted. The resulting signal is stored in the area for VD provided in the stack memory 16. Later, likewise, the supply voltages VB, VL, and then the analog signals I1, I2, ..., In are selected in sequence and analog-to-digital converted. Each of the corresponding digital signals is stored in the stack memory 16.

In this embodiment, the stack memory 16 holds a memory volume for storing the converted values at maximum 16 periods. If the stack memory 16 has already stored the converted values at 16 periods, when a combination of signals at new periods is stored, these signals are written on the signal data at the oldest periods in sequence and these pieces of the oldest signal data are lost.

In this embodiment, the A/D converting unit 13 provides an input range of ±5 V, a resolution of 12 bits and one digit set as 2.44 mV. Hence, the binary value stored in the stack memory 16 is described as follows if it is represented in hexadecimal notation; −5 V is (000)16, 0 V is (800)16, and +5 V is (FFF)16. Since the reference voltage Vref is 0 V, the converted value is directly stored in the stack memory 16, while the supply voltages VD (+12 V), $V_B$(−12 V), and $V_L$(+5 V) are divided through the effect of the resistance and then the divided voltages are applied to the A/D converting unit 13. To simplify the description, the actual voltage value in FIG. 7 is described at mV unit in decimal notation.

Later, the description will be oriented to the procedure for determining whether or not the A/D converter 13 is abnormal with reference to the flowcharts.

The control flow is executed by a program stored in the control unit 14.

Figure 3:
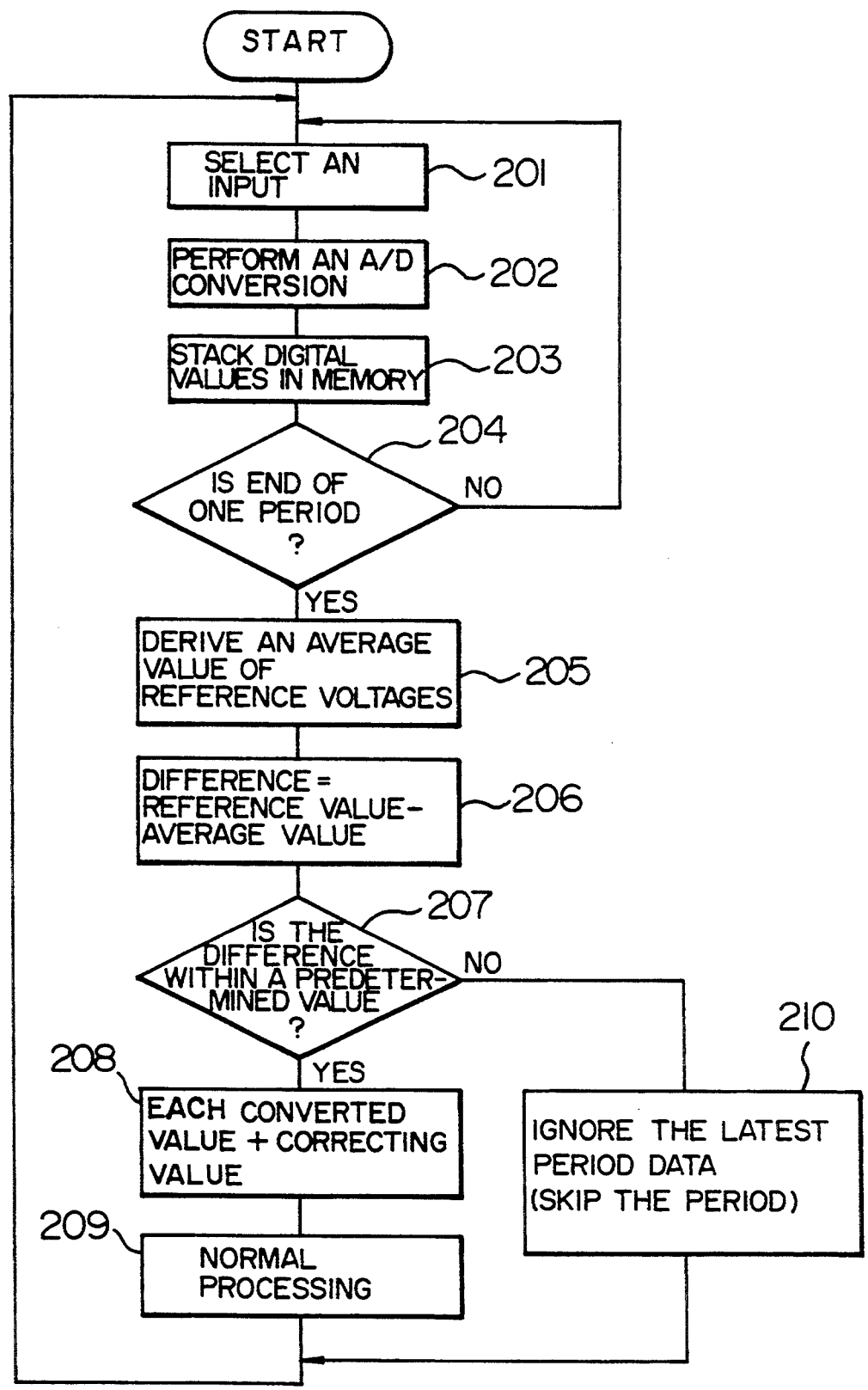
FIG. 3 is a flowchart showing a procedure for detecting an abnormality according to a first embodiment of the present invention.
Figure 4:
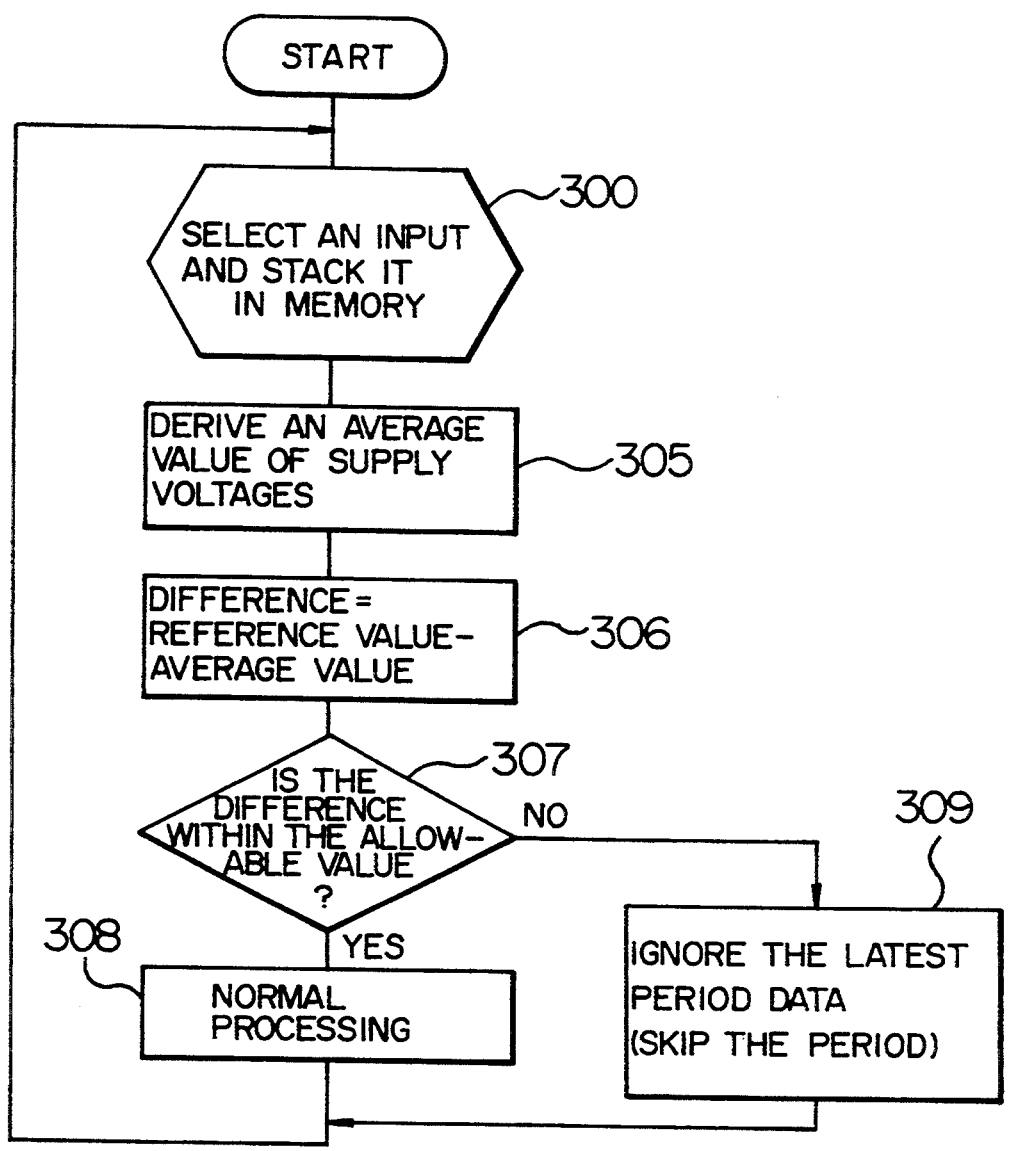
FIG. 4 is a flowchart showing a procedure for detecting an abnormality according to a second embodiment of the present invention.

At first, the description will be oriented to the method according to the first embodiment which operates to detect an abnormality or correct it by using an average value of reference voltages at plural periods with reference to the flowchart shown in FIG. 3.

At first, the reference voltage Vref is selected (step 201) and is analog-to-digital converted (step 202). The corresponding digital voltage is stored in the Vref area for the corresponding period, which is stored in the stack memory 16 (step 203).

At a step 204, turning the operation to the step 201, a supply voltage VD is selected (step 201) and is analog-to-digital converted (step 202). The corresponding digital signal is stored in the VD area for the corresponding period, which is also held in the stack memory 16 (step 203).

Later, likewise, the process from the steps 201 to 204 is repeated with respect to the supply voltages VB, $V_L$ and then the analog signals I1, I2, ..., In. Each converted signal is stored in the storage area for the corresponding period, provided in the stack memory 16. When storage of one combination of data at the period is terminated, the operation goes to the step 205.

At the step 205, if the A/D converter 13 is in the constant state, the average value of the reference voltages at 16 periods is derived, because the stack memory 16 holds the data at the past 16 periods.

Immediately after the A/D converter is started and all the data signals at the 16 periods are not still stacked (data at the five periods, for example), the average value of the data values at the periods (five periods, for example) being stacked is derived (step 205).

Next, an error is derived from a difference between an ideal reference value (defined value, 0 V in this case) of the reference voltage Vref and the average value (for example, 4.88 mV) (step 206). The derived error is compared with a predetermined allowable value (for example, 61 mV) (step 207). If the error is equal to or less than the allowable value, it is determined that the A/D converter is normal and the error is set as a correcting value (step 209).

At a step 208, the correcting value is added to the converted values of the analog input signals I1, I2, ... , In. In this example, since the difference is 4.88 mV, 4.88 m V is subtracted from the converted value of each analog input signal. The subtracted result is a correct A/D converted value. Then, the normal process is executed to transmit these converted values to the upper device or allow the A/D converter itself to determine whether or not these converted values are proper.

However, if, at the step 206, an error is larger than an allowable value, it is determined that the A/D converter is abnormal (step 210) and each piece of data at the period (containing the converted value of the reference voltage) is ignored (skipped). Then, the operation returns to the input selection of the analog signal (step 201).

Hence, the output of the converted values at this period is inhibited. A higher-rank unit has to use the previous converted values. With this function, the erroneous operation done by transient noises is allowed to be prevented.

In turn, the description will be oriented to the method for detecting an abnormality by using an average value of supply voltages at plural periods according to a second embodiment of the present invention.

At first, at a step 300, the selection is executed with respect to the reference voltage Vref, the supply voltages VD, VB, $V_L$ and the analog signals I1, I2, ..., In in sequence. Each of the selected signals is analog-to-digital converted and then is stored in the storage area for the corresponding period, built in the stack memory 16. That is, the operation at the step 300 is analogous to the operation from the steps 201 to 204 included in the first embodiment. After storage of the data at this period is terminated, the operation goes to a step 305.

At the step 305, if the A/D converter 13 is in the constant state, the stack memory 16 holds data of 16 periods. Hence, an average value of the converted value of each supply voltage VD, $V_B$ or $V_L$ at 16 periods is derived.

Immediately after the A/D converter is started and the data of 16 periods are not still stacked in the stack memory 16, an average value of the data of the periods being stacked is derived. In addition, to simplify the description, the checking operation of one supply voltage is described. This operation holds true to the supply voltages VD, VB and VL.

Next, an error is derived from the difference between the reference value (ideal reference value) of the supply voltage and the average value (step 306). The derived error is compared with the predetermined allowable value (step 307). If the error is equal to or less than the allowable value, it is determined that the A/D converter operates normally. The same normal processing as the step 211 is carried out (step 308).

If, on the other hand, the error is larger than the allowable value, it is determined that the A/D converter is abnormal. Each piece of data at the corresponding period (containing the converted value of the supply voltage) is ignored (skipped) (step 309).

Then, the process is returned to the input selection of the analog signal (step 300).

Figure 5:
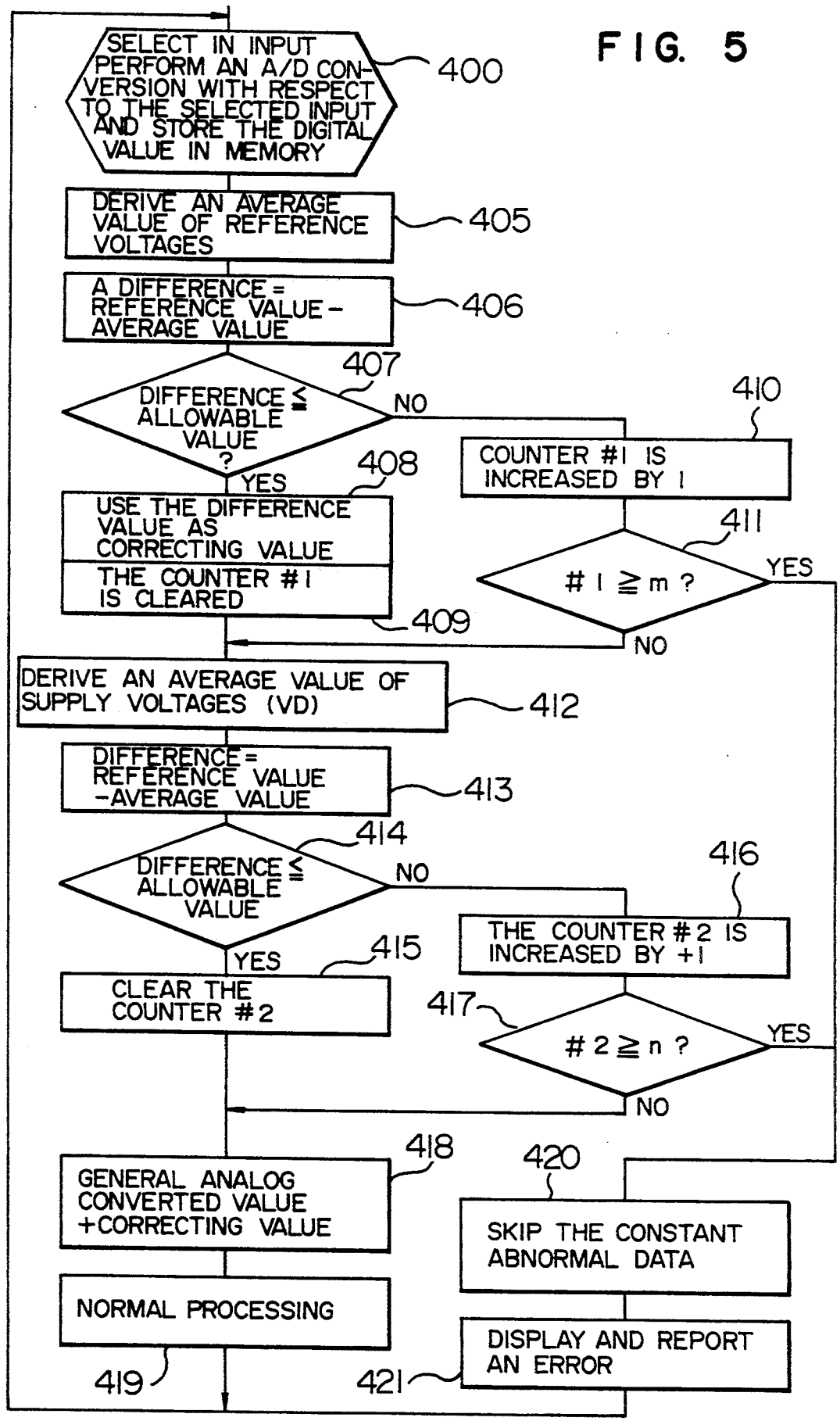
FIG. 5 is a flowchart showing a procedure for detecting an abnormality according to a third embodiment of the present invention.

Next, the description will be oriented to the method for detecting or correcting an abnormality by using an average value of the reference voltages and the supply voltages at plural periods according to a third embodiment of the present invention with reference to the flowchart shown in FIG. 5.

At first, at a step 400, the input selection is performed with respect to each of the reference voltage Vref, the supply voltages VD, VB, VL, and the analog signals I1, I2, ..., In in sequence and each selected signal is analog-to-digital converted into the digital signal. The digital signal is stored in the storage area for the corresponding period, provided in the stack memory 16. The operation at the step 400 is the same as the process from the steps 201 to 204.

When storage of the data at the corresponding period is terminated, the operation goes to a step 405.

At the step 405, if the A/D converter 13 is in the constant state, the stack memory 16 holds data of 16 periods. Hence, an average value is derived from the converted values of the reference voltages Vref at 16 periods.

Immediately after the A/D converter is started and the data of 16 periods is not still stacked in the stack memory 16, the average value of the data of the stacked periods is derived.

Next, a difference (error) between the reference value (ideal reference value) of the reference voltage Vref and the average value is derived (step 406). The error is compared with the predetermined allowable value (step 407). If the error is equal to or less than the allowable value, it is determined that the A/D converter operates normally. Then, the error value is set as a correcting value (step 408). The counter #1 is cleared (step 409).

If, on the other hand, the error is larger than the allowable, it is determined that the A/D converter operates abnormally. A value of 1 is added to the counter #1 (step 410). It is checked whether or not the value of the counter #1 is equal to or more than a predetermined value m (m=3 in the embodiment) (step 411). If it is lower than the predetermined value 3, the operation goes to a step 412.

If the counter #1 indicates a value which is equal to or larger than the predetermined value "3", the operation goes to a step 420.

Next, at the step 412, if the A/D converter 13 is in the constant state, the stack memory 16 holds data of 16 periods. Hence, an average value of the converted values of the supply voltages VD at 16 periods is derived.

Immediately after the A/D converter is started and the data of 16 periods are not still stacked in the stack memory 16, an average value of the data at the periods being stacked is derived.

To simplify the description about the power supply check, the process from the steps 412 to 417 has been described about checking only the supply voltage VD. This process holds true to checking the other supply voltages VB and VL. In this case, it goes without saying that the step for another supply voltage $V_B$ or $V_L$ is inserted between the steps 417 and 418 shown in FIG. 5.

Next, a difference (error) is derived between the ideal reference value (called as a defined value) and the average value is derived (step 413). The derived error is compared with the predetermined allowable value (step 414). If the error is equal to or less than the allowable value, it is determined that the A/D converter operates normally. A counter #2 provided in the counter area of the RAM 22 is cleared (step 415). Then, the operation goes to a step 418.

If, on the other hand, the error is more than the allowable value, it is determined that the A/D converter operates abnormally. A value of 1 is added to the counter #2 (step 416). It is checked whether or not the actual value of the counter #2 is equal to or more than a predetermined value n (n=3) (step 417). If the actual value of the counter #2 is less than the predetermined value "3" the operation goes to the step 418.

If the actual value of the counter #2 is equal to or more than the predetermined value "3" the operation goes to a step 420.

At the step 418, a correcting value is added to the converted value of the analog input value. The added result is a proper A/D converted value. Then, the normal process is executed to transmit a proper A/D value to the higher-rank unit or allow the A/D converter itself unit to determine whether or not it is proper. Then, the operation returns to the step 400.

At the step 420, all the data at this period is ignored (skipped) and it is determined that a constant abnormality takes place in the A/D converter. The fact is displayed on the A/D converter or reported to the higher-rank unit (step 421).

Next, the operation returns to the step of selecting an analog signal when it is inputted.

In addition, the method and the apparatus according to this embodiment provides the same number of counters as voltages to be checked. In place, just one counter may be used for checking plural voltages.

Moreover, the method and the apparatus according to this embodiment are arranged to compare an average value of plural converted values with the ideal reference value. In place, the total of the converted values may be compared with a total of the corresponding plural ideal reference values.

As set forth above, according to the present invention, if detection of an abnormality continuously takes place plural times, it is determined that the constant abnormality takes place. This results in preventing erroneous detection due to transient disturbances like noises or lowering of conversion accuracy.

Further, the abnormality of the device is detected before a fatal fault due to an abnormal supply voltage takes place. Only when it is determined that the device operates normally, the resulting signal is outputted to the outside. The devices connected to the A/D converter are allowed to do highly reliable processing.

What is claimed is:

1. A method for detecting an abnormality in an analog-to-digital (A/D) converter having an A/D converting unit, comprising the steps of:

periodically converting a constant voltage required for operating said A/D converting unit into a digital value by feeding said constant voltage to an input terminal for an A/D conversion signal of said A/D converting unit, wherein within one period after each digital conversion of said constant voltage, and A/D converting unit converts at least one analog input signal fed to said signal input terminal to a digital value;

comparing an average value of plural digital converted values of said constant voltage with a predetermined ideal reference value and deriving a difference between them; and detecting a transient abnormality in said A/D converter and performing a predetermined measure against a transient abnormality when said difference is larger than a predetermined allowable value.

2. A method as claimed in claim 1, wherein said measure contains a process of ignoring as an abnormal value a digital converted value of at least one analog input signal within one period after the last digital conversion of plural digital conversions of said constant voltage.

3. A method as claimed in claim 2, wherein said measure contains a process of ignoring as an abnormal value said last digital converted value of said constant voltage.

4. A method as claimed in claim 1, wherein when said transient abnormality is continuously detected over predetermined plural periods, occurrence of a constant abnormality is detected in said A/D converter and a predetermined measure against said constant abnormality is performed.

5. A method as claimed in claim 4, wherein said measure against the constant abnormality contains a process of reporting occurrence of an error in said A/D converter to an upper device.

6. A method as claimed in claim 1, wherein said constant voltage is a reference voltage for said A/D converting unit.

7. A method as claimed in claim 1, wherein said constant voltage is a supply voltage for said A/D converting unit.

8. A method for detecting an abnormality in an analog-to-digital (A/D) converter having an A/D converting unit, comprising the steps of:

(a) periodically converting a reference voltage required for operating said A/D converting unit into a digital value by feeding said reference voltage to an input terminal for an A/D converting signal provided in said A/D converting unit;

(b) comparing an average value of plural digital converted values of said reference voltage with a predetermined ideal reference value and deriving a difference between them;

(c) detecting a transient abnormality in said A/D converter when said difference is larger than a predetermined allowable value;

(d) detecting a constant abnormality in said A/D converter when said steps (a) and (b) are repeated m times (m is an integer of 2 or more) and said difference is serially larger than said predetermined allowable value m times, and performing a predetermined measure against said constant abnormality;

(e) except said step (d), feeding said supply voltage to said signal input terminal provided in said A/D converting unit to periodically convert a supply voltage required for operating said A/D converting unit into a digital value;

(f) comparing an average value of plural digital converted values of said supply voltage into a predetermined ideal reference value and deriving a difference between them;

(g) when said difference is larger than a predetermined allowable value, detecting a transient abnormality in said A/D converter; and (h) when said steps (e) and (f) are repeated n times (n is an integer of 2 or more) and said difference is serially larger than said predetermined allowable value n times, detecting a constant abnormality in said A/D converter and performing a predetermined measure against said predetermined constant abnormality.

9. A method for detecting an abnormality in an analog-to-digital (A/D) converter having an A/D converting unit, comprising the steps of:

(a) feeding said constant voltage to an input terminal for an A/D conversion of said A/D converting unit to periodically convert a constant voltage required for operating said A/D converting unit into a digital value, wherein within one period after each digital conversion of said constant voltage, said A/D converting unit converts at least one analog input signal fed to said signal input terminal to a digital value;

(b) comparing a total of plural digital converted values of said constant voltage with a predetermined ideal reference value and deriving a difference between them;

(c) when said difference is larger than a predetermined allowable value, detecting a transient abnormality in said A/D converter and performing a predetermined measure against said detected transient abnormality.

10. An apparatus for detecting an abnormality in an analog-to-digital (A/D) converter, comprising:

an A/D converting unit having an input terminal for an A/D conversion signal;

a signal selecting unit for selecting one of plural analog input signals to be converted into a digital value and feeding said selected signal to said signal input terminal;

one or more signal lines for feeding a constant voltage required for operating said A/D converting unit to said signal selecting unit as one of plural analog input signals to be converted to said digital values;

stack memory means for storing a digital converted value from said A/D converting unit; and control means being connected to said A/D converting unit, said signal selecting unit and said stack memory means and for controlling an operation of said A/D converter;

said signal selecting unit sequentially feeding said constant voltage and said plural input signals to said signal input terminal of said A/D converting unit to periodically convert said constant voltage and plural input signals following said constant voltage into digital values, under the control of said control means;

said control means operating to stack a combination of said digital values converted within the same period at the same level of said stack memory;

said control means operating to derive an average value of plural digital converted values of said constant voltage stored at plural stack levels of said stack memory, compare said average value with a predetermined ideal reference value, and derive a difference between them; and when said difference is larger than a predetermined allowable value, said control means operating to detect a transient abnormality in said A/D converter and perform a predetermined measure against said detected transient abnormality.

11. An apparatus as claimed in claim 10, wherein said measure contains a process of ignoring as an abnormal value a digital converted value of said analog input signal within one period after the last digital conversion of plural digital conversions of said constant voltage.

12. An apparatus as claimed in claim 11, wherein said measure contains a process of ignoring as an abnormal value said last digital converted value of said constant voltage.

13. An apparatus as claimed in claim 10, wherein when said transient abnormality is serially detected over predetermined periods, said control means detects a constant abnormality in said A/D converter and performs a predetermined measure against said constant abnormality.

14. An apparatus as claimed in claim 13, wherein said measure against said constant abnormality contains a process of reporting an error of said A/D converter to a higher-rand unit.

15. An apparatus as claimed in claim 10, wherein said constant voltage is a reference voltage for said A/D converting unit.

16. An apparatus as claimed in claim 10, wherein said constant voltage is a supply voltage for said A/D converting unit.

17. An apparatus for detecting an abnormality in an analog-to-digital (A/D) converter, comprising:

an A/D converting unit having an input terminal of an A/D conversion;

a signal selecting unit for selecting one of plural analog input signals to be converted into digital values and feeding said selected signal to said input terminal of said A/D converting unit;

a signal line for feeding a reference voltage and a supply voltage required for operating said A/D converting unit as plural analog input signals to be converted into said digital values to said signal selecting unit;

stack memory means for storing digital converted values from said A/D converting unit;

counter means provided for said reference voltage and supply voltage;

control means for controlling an operation of said A/D converter;

said signal selecting unit sequentially feeding said signals to said signal input terminal of said A/D converting unit to periodically convert said reference voltage, said supply voltage, plural input signals following said supply voltage into digital values, under the control of said control means;

said control means operating to stack a combination of digital values converted within he same period at the same level of said stack memory;

when a difference between an average value of plural digital converted values and a predetermined ideal reference value is larger than a predetermined allowable value with respect to one of said reference voltage and said supply voltage stored at plural stack levels of said stack memory, said control means operating to detect a transient abnormality in said A/D converter and perform a predetermined measure against said transient abnormality, increase a count of said related counter means by 1, and clear a count value of said counter means if said difference is less than said allowable value.

18. An apparatus as claimed in claim 17, wherein when the count value of said counter means is greater than or equal to a predetermined value with respect to one of said reference voltage and said supply voltage stored at plural stack levels of said stack memory, said control means operates to detect a constant abnormality in said A/D converter and perform a predetermined measure against said detected constant abnormality.

19. An apparatus as claimed in claim 18, wherein said measure against said constant abnormality contains a process of reporting an error of said A/D converter to [an]a higher-rank unit.

* * * * *

UNITED STATES PATENT AND TRADEMARK OFFICE
CERTIFICATE OF CORRECTION

PATENT NO. : 5,432,514
DATED : July 11, 1995
INVENTOR(S) : Youji Mukuda, et al.

It is certified that error appears in the above-indentified patent and that said Letters Patent is hereby corrected as shown below:

Claim 14, column 10, line 19, delete "rand" and substitute therefor --rank--.

Claim 17, column 10, line 52, delete "he" and substitute therefor --the--.

Claim 19, column 12, line 3, delete "[an]".

Signed and Sealed this

Twelfth Day of September, 1995

*Attest:*

BRUCE LEHMAN

*Attesting Officer*    Commissioner of Patents and Trademarks